(12) United States Patent
Shinohara et al.

(10) Patent No.: US 6,384,316 B1
(45) Date of Patent: May 7, 2002

(54) PHOTOVOLTAIC DEVICE

(75) Inventors: Wataru Shinohara, Katano; Yasuaki Yamamoto, Nara, both of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/641,076

(22) Filed: Aug. 17, 2000

(30) Foreign Application Priority Data

Sep. 8, 1999 (JP) ............................................ 11-254889

(51) Int. Cl.$^7$ ............................................ H01L 31/075
(52) U.S. Cl. ...................... 136/255; 136/249; 136/258; 136/261; 257/458; 257/464; 257/53; 257/65
(58) Field of Search ................................. 136/255, 249, 136/258, 261; 257/458, 464, 53, 65

(56) References Cited

FOREIGN PATENT DOCUMENTS

| JP | 64-76777 A | * | 3/1989 |
| JP | 2-164078 A | * | 6/1990 |
| JP | 4-167474 A | * | 6/1992 |
| JP | 5-206492 A | * | 8/1993 |

* cited by examiner

*Primary Examiner*—Alan Diamond
(74) *Attorney, Agent, or Firm*—Darby & Darby

(57) ABSTRACT

A photovoltaic device having a structure in which a transparent conductive film, a p-type amorphous silicon layer, an i-type amorphous silicon layer, an n-type microcrystalline silicon layer and a back electrode film are laminated on a transparent substrate so as to satisfy the conditions of $$50 \text{ Å} < dc_1 < da_1 \times \alpha_1 \quad (1)$$

and $$0.124 < \alpha_1 < 0.130 \quad (2),$$

where $da_1$ is the total thickness (Å) of the p-type amorphous silicon layer and i-type amorphous silicon layer, and
$dc_1$ is the thickness (Å) of the n-type microcrystalline silicon layer.

9 Claims, 7 Drawing Sheets

$50 Å < d_{c1} < d_{a1} \times \alpha_1$
$0.124 < \alpha_1 < 0.130$
$30 Å < d_{c2} < d_{a2} \times \alpha_2$
$0.079 < \alpha_2 < 0.083$

PHOTOVOLTAIC DEVICE

BACKGROUND OF THE INVENTION

The present invention relates to a photovoltaic device, and more particularly relates to a photovoltaic device including a laminated product (pin junction) of a p-type amorphous layer, an i-type amorphous layer and an n-type microcrystalline layer.

FIG. 1 is a structural view of a conventional photovoltaic device having a laminated product of a p-type amorphous layer, an i-type amorphous layer and an n-type microcrystalline layer. In FIG. 1, numeral 31 is a transparent substrate. A transparent conductive film 32, a p-type amorphous silicon layer 33, an i-type amorphous silicon-layer 34, an n-type microcrystalline silicon layer 35 and a back electrode film 36 are laminated in this order on the transparent substrate 31.

In a photovoltaic device having such a structure, each of the silicon layers 33, 34 and 35 is usually deposited by a plasma CVD process. In this case, there is a possibility that peeling occurs between the amorphous layer and the microcrystalline layer due to stress generated at the time when the layers are cooled to room temperature from the deposition temperature. The cause of peeling will be described below.

FIG. 2 is a conceptual view of stress generated in this silicon laminated product. The stress includes internal stress which is caused by a structural change between the amorphous layer and the microcrystalline layer, and thermal stress which is generated when cooling the layers deposited in a high temperature condition to room temperature. In the case of hydrogenated amorphous silicon (a-Si:H) deposited by the plasma CVD process, it has been known that the internal stress refers to compressive stress for the amorphous layer in which the $SiH_2$ bond content is smaller than the SiH bond content, while the internal stress refers to tensile stress for the microcrystalline layer in which the $SiH_2$ bond content is greater than the SiH bond content. In contrast, since the thermal stress is proportional to the difference in the thermal expansion coefficient between the respective layers, tensile stress proportional to the deposition temperature is generated in a thin film that was cooled to room temperature after being deposited in a high temperature condition of not lower than 100° C.

Peeling of the silicon layers does not occur immediately after the deposition thereof at high temperatures, but occurs just after they have been cooled to room temperature. It would therefore be supposed that peeling occurs when the amorphous layer as an under layer is creased by thermal stress (tensile stress) generated in the microcrystalline layer.

Thus, the conventional photovoltaic device including the laminated product of the amorphous layers and microcrystalline layer suffers from a problem that film peeling occurs between the amorphous layer and the microcrystalline layer.

BRIEF SUMMARY OF THE INVENTION

It is an object of the present invention to provide a photovoltaic device in which film peeling does not occur between an amorphous layer and a microcrystalline layer.

A photovoltaic device according to the first aspect includes at least one laminated product made by laminating a p-type amorphous layer, an i-type amorphous silicon layer, and an n-type microcrystalline layer in which the volume fraction of crystal phase is not less than 30% and the $SiH_2$ bond content is greater than the SiH bond content, wherein the laminated product satisfies the conditions of $$50 \text{ Å} < dc_1 < da_1 \times \alpha_1 \tag{1}$$

and $$0.124 < \alpha_1 < 0.130 \tag{2},$$

where $da_1$ is the total thickness (Å) of the p-type amorphous layer and i-type amorphous silicon layer, and $dc_1$ is the thickness (Å) of the n-type microcrystalline layer.

A photovoltaic device according to the second aspect includes at least one laminated product made by laminating a p-type amorphous layer, an i-type amorphous silicon germanium layer, and an n-type microcrystalline layer in which the volume fraction of crystal phase is not less than 30% and the $SiH_2$ bond content is greater than the SiH bond content, wherein the laminated product satisfies the conditions of $$30 \text{ Å} < dc_2 < da_2 \times \alpha_2 \tag{3}$$

and $$0.079 < \alpha_2 < 0.083 \tag{4},$$

where $da_2$ is the total thickness (Å) of the p-type amorphous layer and i-type amorphous silicon germanium layer, and $dc_2$ is the thickness (Å) of the n-type microcrystalline layer.

A photovoltaic device according to the third aspect includes: at least one first laminated product made by laminating a p-type amorphous layer, an i-type amorphous silicon layer, and an n-type microcrystalline layer in which the volume fraction of crystal phase is not less than 30% and the $SiH_2$ bond content is greater than the SiH bond content; and at least one second laminated product made by laminating a p-type amorphous layer, an i-type amorphous silicon germanium layer, and an n-type microcrystalline layer in which the volume fraction of crystal phase is not less than 30% and the $SiH_2$ bond content is greater than the SiH bond content, wherein the laminated products satisfy the conditions of the above expressions (1) to (4).

According to the photovoltaic device of the present invention, in the laminated product made by laminating a p-type amorphous layer, an i-type amorphous silicon layer and an n-type microcrystalline layer and/or the laminated product made by laminating a p-type amorphous layer, an i-type amorphous silicon germanium layer and an n-type microcrystalline layer, the thickness of each of the layers is set as described above. With this settings, it is possible to reduce the effect of thermal stress (tensile stress) generated in the n-type microcrystalline layer and prevent film peeling.

The above and further objects and features of the invention will more fully be apparent from the following detailed description with accompanying drawings.

DETAILED DESCRIPTION OF THE INVENTION

The following description will specifically explain the present invention with reference to the drawings illustrating the embodiments thereof.

(First Embodiment)

Figure 1:
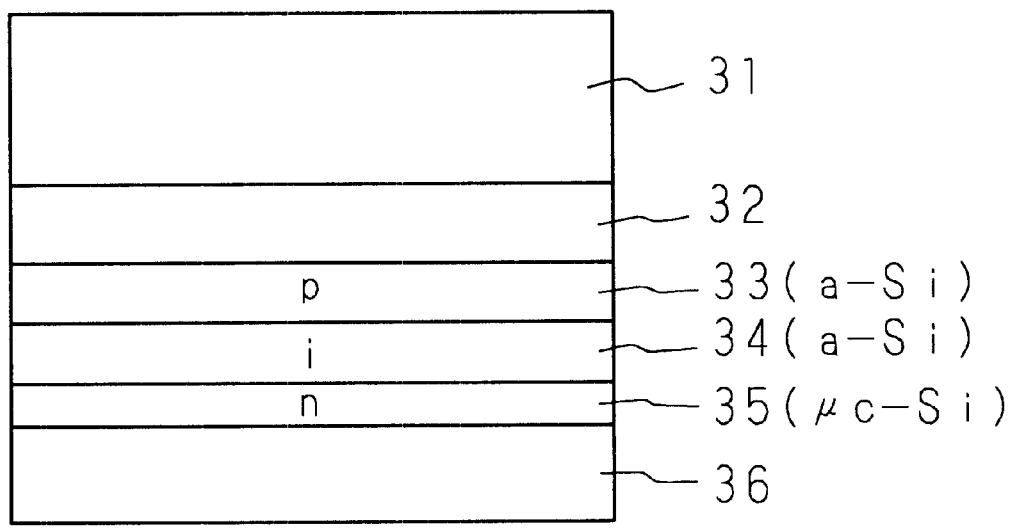
FIG. 1 is a structural view of a conventional photovoltaic device.
Figure 2:
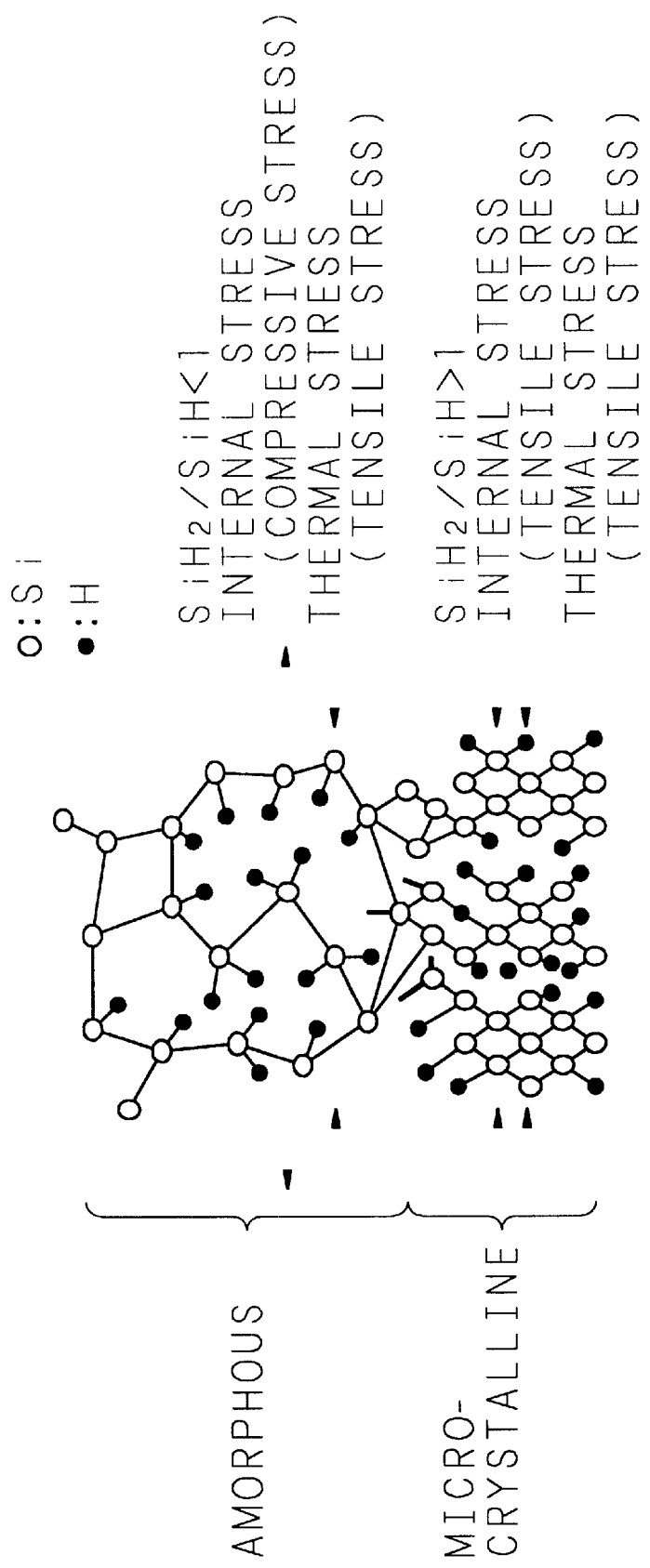
FIG. 2 is a conceptual view of stress generated in a silicon laminated product.
Figure 3:
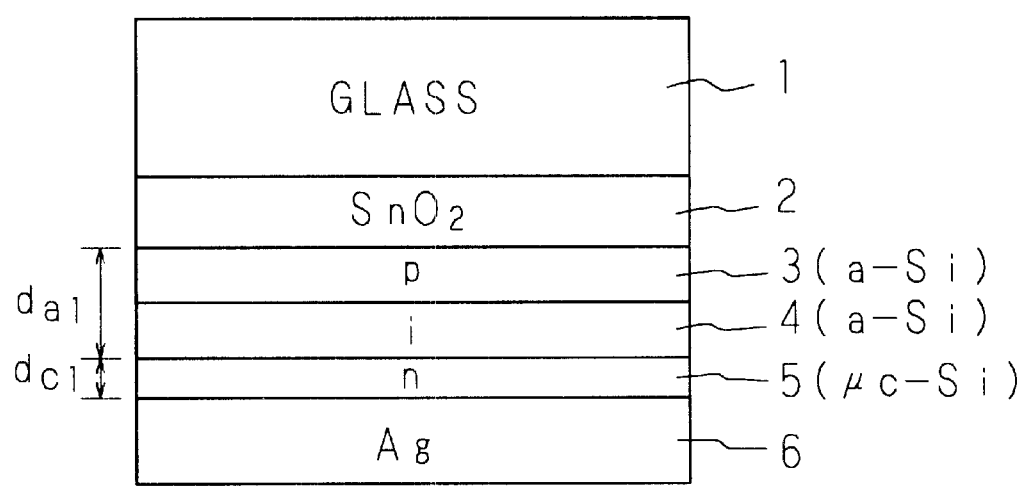
FIG. 3 is a structural view of the first embodiment of a photovoltaic device of the present invention.

FIG. 3 is a structural view of the first embodiment of a photovoltaic device of the present invention. In FIG. 3, numeral 1 is a transparent substrate formed by, for example, a glass substrate. A transparent conductive film 2 formed by, for example, an $SnO_2$ film, a p-type amorphous silicon layer 3, an i-type amorphous silicon layer 4, an n-type microcrystalline silicon layer 5 and a back electrode film formed by, for example, an Ag film are laminated in this order on the transparent substrate 1. In this n-type microcrystalline silicon layer 5, the volume fraction of crystal phase is not less than 30%, and the $SiH_2$ bond content is greater than the SiH bond content.

The relationship of the thicknesses of the p-type amorphous silicon layer 3, the i-type amorphous silicon layer 4 and the n-type microcrystalline silicon layer 5 satisfies the conditions of the following expressions (1) and (2):

$$50 \text{ Å} < dc_1 < da_1 \times \alpha_1 \quad (1)$$

and $$0.124 < \alpha_1 < 0.130 \quad (2),$$

where $da_1$ is the total thickness (Å) of the p-type amorphous silicon layer 3 and the i-type amorphous silicon layer 4, and $dc_1$ is the thickness (Å) of the n-type microcrystalline silicon layer 5.

Figure 4:
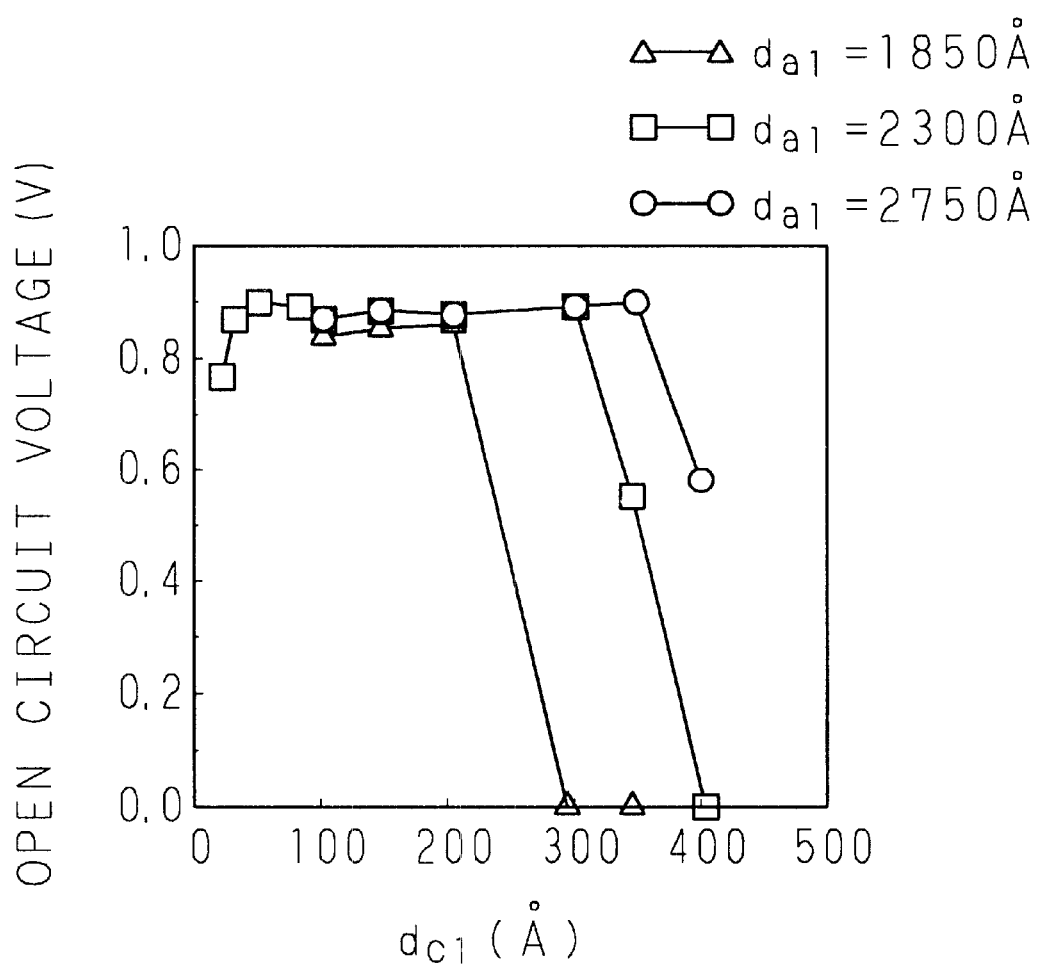
FIG. 4 is a graph showing the relationship between the thickness of an n-type microcrystalline layer and an open circuit voltage according to the first embodiment.

The reasons for setting such conditions will be explained below. In each of photovoltaic devices having three types of thickness (1850 Å, 2300 Å and 2750 Å) as $da_1$ mentioned above, the open circuit voltage was measured while changing the thickness $dc_1$. The results of measurement are shown in FIG. 4. In FIG. 4, Δ-Δ shows the results of measurement when $da_1$ was 1850 Å, □-□ shows the results of measurement when $da_1$ was 2300 Å, and o-o shows the results of measurement when $da_1$ was 2750 Å.

When the thickness ($dc_1$) of the n-type microcrystalline silicon layer 5 was 50 Å or less, a sufficient internal electric field was not generated and therefore the open circuit voltage was lowered.

On the other hand, when the thickness ($dc_1$) of the n-type microcrystalline silicon layer 5 was made greater than a certain value, the open circuit voltage was lowered due to a short circuit caused by peeling. The threshold of the lowering of the open circuit voltage was $dc_1$ of 230 Å when $da_1$ was 1850 Å, $dc_1$ of 300 Å when $da_1$ was 2300 Å, and $dc_1$ of 350 Å when $da_1$ was 2750 Å. In these cases, the ratio of $dc_1$ to $da_1$ is given as 230/1850≈0.124, 300/2300≈0.130, and 350/2750≈0.127, respectively.

Therefore, by arranging the thickness ($dc_1$) of the n-type microcrystalline silicon layer 5 to be greater than 50 Å but to be smaller than 0.124 to 0.130 times the total thickness ($da_1$) of the p-type amorphous silicon layer 3 and i-type amorphous silicon layer 4, i.e., by satisfying the conditions of the above expressions (1) and (2), it is possible to obtain a photovoltaic device that does not have peeling and achieves a high open circuit voltage.

Incidentally, the above-described example illustrates a photovoltaic device including only one laminated product of a p-type amorphous silicon layer, an i-type amorphous silicon layer and an n-type microcrystalline silicon layer. However, it is also possible to prevent peeling in a photovoltaic device that includes a plurality of such laminated products (in a tandem structure or a structure in which at least three laminated products are stacked) by arranging each of the laminated products to satisfy the conditions of the above expressions (1) and (2).

(Second Embodiment)

Figure 5:
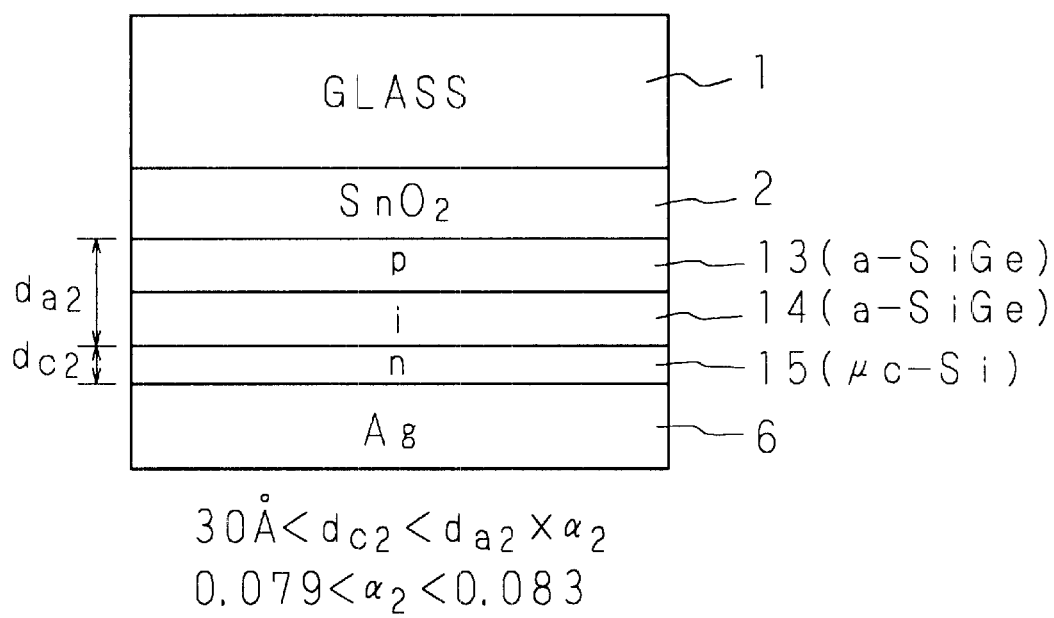
FIG. 5 is a structural view of the second embodiment of a photovoltaic device of the present invention.

FIG. 5 is a structural view of the second embodiment of a photovoltaic device of the present invention. In FIG. 5, numeral 1 is a transparent substrate formed by, for example, a glass substrate. A transparent conductive film 2 formed by, for example, an $SnO_2$ film, a p-type amorphous silicon germanium layer 13, an i-type amorphous silicon germanium layer 14, an n-type microcrystalline silicon layer 15 and a back electrode film formed by, for example, an Ag film are laminated in this order on the transparent substrate 1. In this n-type microcrystalline silicon layer 15, the volume fraction of crystal phase is not less than 30%, and the $SiH_2$ content is greater than the SiH content.

The relationship of the thicknesses of the p-type amorphous silicon germanium layer 13, the i-type amorphous silicon germanium layer 14 and the n-type microcrystalline silicon layer 15 satisfies the conditions of the following expressions (3) and (4):

$$30 < dc_2 < da_2 \times \alpha_2 \quad (3)$$

and $$0.079 < \alpha_2 < 0.083 \quad (4),$$

where $da_2$ is the total thickness (Å) of the p-type amorphous silicon germanium layer 13 and the i-type amorphous silicon germanium layer 14, and $dc_2$ is the thickness (Å) of the n-type microcrystalline silicon layer 15.

Figure 6:
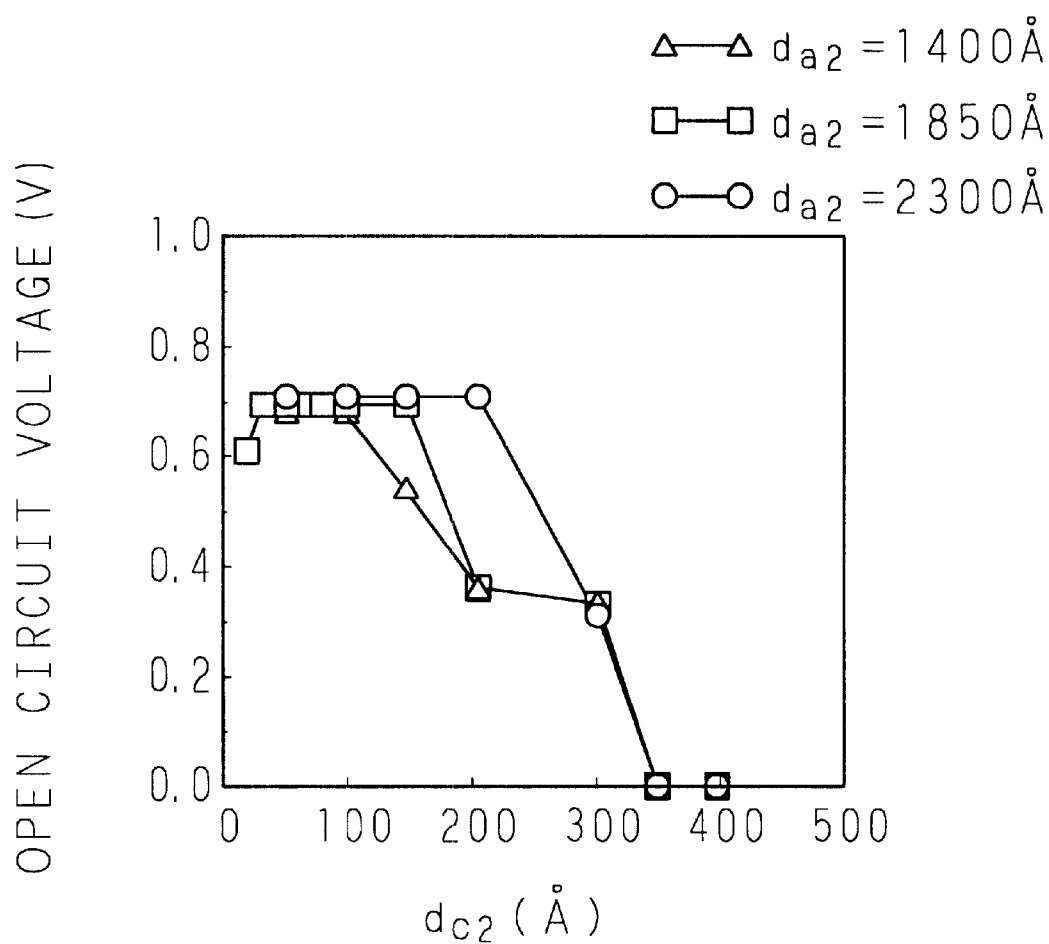
FIG. 6 is a graph showing the relationship between the thickness of an n-type microcrystalline layer and an open circuit voltage according to the second embodiment.

The reasons for setting such conditions will be explained below. In each of photovoltaic devices having three types of thickness (1400 Å, 1850 Å and 2300 Å) as $da_2$ mentioned above, the open circuit voltage was measured while changing the thickness $dc_2$. The results of measurement are shown in FIG. 6. In FIG. 6, Δ-Δ shows the results of measurement when $da_2$ was 1400 Å, □-□ shows the results of measurement when $da_2$ was 1850 Å, and o-o shows the results of measurement when $da_2$ was 2300 Å.

When the thickness ($dc_2$) of the n-type microcrystalline silicon layer 15 was 30 Å or less, a sufficient internal electric field was not generated and therefore the open circuit voltage was lowered.

On the other hand, when the thickness ($dc_2$) of the n-type microcrystalline silicon layer 15 was made greater than a certain value, the open circuit voltage was lowered due to a short circuit caused by peeling. The threshold of the lowering of the open circuit voltage was $dc_2$ of 110 Å when $da_2$ was 1400 Å, $dc_2$ of 150 Å when $da_2$ was 1850 Å, and $dc_2$ of 190 Å when $da_2$ was 2300 Å. In these cases, the ratio of $dc_2$ to $da_2$ is given as 110/1400≈0.079, 150/1850≈0.081, and 190/2300≈0.083, respectively.

Therefore, by arranging the thickness ($dc_2$) of the n-type microcrystalline silicon layer 15 to be greater than 30 Å but to be smaller than 0.079 to 0.083 times the total thickness ($da_2$) of the p-type amorphous silicon germanium layer 13 and i-type amorphous silicon germanium layer 14, i.e., by satisfying the conditions of the above expressions (3) and (4), it is possible to obtain a photovoltaic device that does not have peeling and achieves a high open circuit voltage.

Incidentally, the above-described example illustrates a photovoltaic device including only one laminated product of a p-type amorphous silicon germanium layer, an i-type amorphous silicon germanium layer and an n-type microcrystalline silicon layer. However, it is also possible to prevent peeling in a photovoltaic device that includes a plurality of such laminated products (in a tandem structure or a structure in which at least three laminated products are stacked) by arranging each of the laminated products to satisfy the conditions of the above expressions (3) and (4).

(Third Embodiment)

Figure 7:
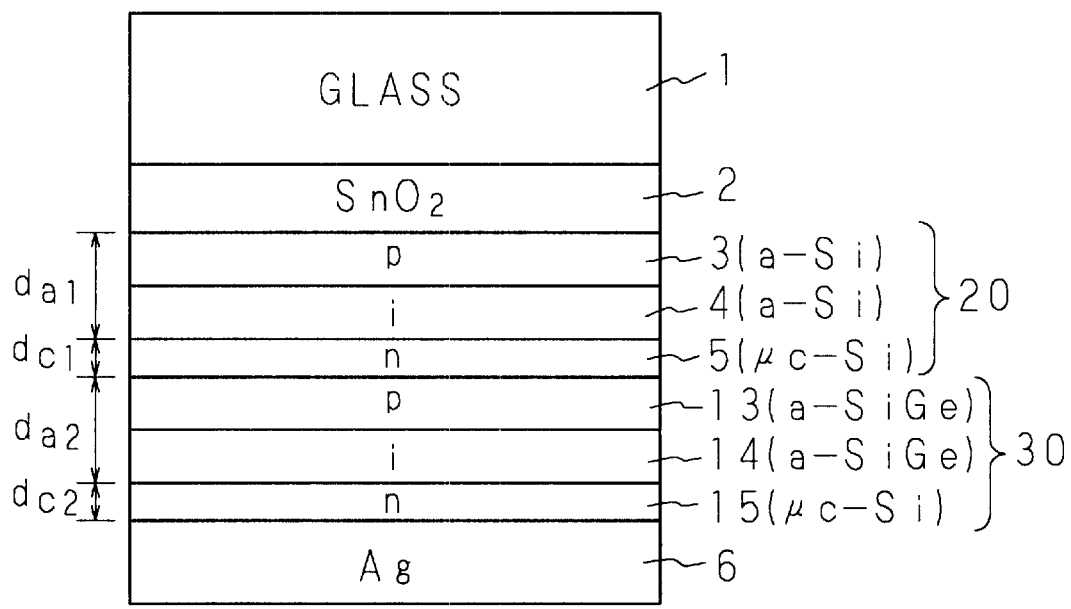
FIG. 7 is a structural view of the third embodiment of a photovoltaic device of the present invention.

FIG. 7 is a structural view of the third embodiment of a photovoltaic device of the present invention. In FIG. 7, the same elements as those shown in FIGS. 3 and 5 are indicated by the same numerals, and the explanation thereof will be omitted. The photovoltaic device shown in FIG. 7 has a tandem structure including: a first pin-junction laminated product 20 of a p-type amorphous silicon layer 3, an i-type amorphous silicon layer 4 and an n-type microcrystalline silicon layer 5; and a second pin-junction laminated product 30 of a p-type amorphous silicon germanium layer 13, an type amorphous silicon germanium layer 14 and an n-type microcrystalline silicon layer 15.

Like the first embodiment, the thickness of each of the p-type amorphous silicon layer 3, i-type amorphous silicon layer 4 and n-type microcrystalline silicon layer 5 of the first pin-junction laminated product 20 satisfies the conditions of the above expressions (1) and (2). Moreover, like the second embodiment, the thickness of each of the p-type amorphous silicon germanium layer 13, i-type amorphous silicon germanium layer 14 and n-type microcrystalline silicon layer 15 of the second pin-junction laminated product 30 satisfies the conditions of the above expressions (3) and (4).

Since the third embodiment also satisfies the conditions of the above expressions (1) to (4), peeling does not occur and a high open circuit voltage is obtained.

In addition, needless to say, the present invention is applicable similarly to a photovoltaic device including a plurality of such first pin-junction laminated products 20 and/or second pin-junction laminated products 30 arranged in a superposed structure.

As described above, in the photovoltaic device of the present invention, since the relationship of the thicknesses of the respective layers constituting the pin-junction laminated product is limited, it is possible to prevent occurrence of film peeling and provide satisfactory photoelectric conversion characteristics.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A photovoltaic device comprising:

a laminated product made by laminating a p-type amorphous layer, an i-type amorphous silicon layer, and an n-type microcrystalline layer in which a volume fraction of crystal phase is not less than 30% and an $SiH_2$ bond content is greater than an SiH bond content, wherein said laminated product satisfies the conditions of $$50 \text{ Å} < dc_1 < da_1 \times \alpha_1 \tag{A}$$

and $$0.124 < \alpha_1 < 0.130 \tag{B},$$

where $da_1$ is a total thickness (Å) of said p-type amorphous layer and i-type amorphous silicon layer, and $dc_1$ is a thickness (Å) of said n-type microcrystalline layer.

2. The photovoltaic device as set forth in claim 1, wherein said photovoltaic device comprises a plurality of said laminated product.

3. A photovoltaic device comprising:

a laminated product made by laminating a p-type amorphous layer, an i-type amorphous silicon germanium layer, and an n-type microcrystalline layer in which a volume fraction of crystal phase is not less than 30% and an $SiH_2$ bond content is greater than an SiH bond content, wherein said laminated product satisfies the conditions of $$30 \text{ Å} < dc_2 < da_2 \times \alpha_2 \tag{C}$$

and $$0.079 < \alpha_2 < 0.083 \tag{D},$$

where $da_2$ is a total thickness (Å) of said p-type amorphous layer and i-type amorphous silicon germanium layer, and $dc_2$ is a thickness (Å) of said n-type microcrystalline layer.

4. The photovoltaic device as set forth in claim 3, wherein said photovoltaic device comprises a plurality of said laminated product.

5. A photovoltaic device comprising:

a first laminated product made by laminating a p-type amorphous layer, an i-type amorphous silicon layer, and an n-type microcrystalline layer in which a volume fraction of crystal phase is not less than 30% and an $SiH_2$ bond content is greater than an SiH bond content; and at least one second laminated product made by laminating a p-type amorphous layer, an i-type amorphous silicon germanium layer, and an n-type microcrystalline layer in which a volume fraction of crystal phase is not less than 30% and an $SiH_2$ bond content is greater than an SiH bond content, wherein said first and second laminated products satisfy the conditions of $$50 \text{ Å} < dc_1 < da_1 \times \alpha_1 \tag{E},$$

$$0.124 < \alpha_1 < 0.130 \quad (F),$$

$$30 \text{ Å} < dc_2 < da_2 \times \alpha_2 \quad (G)$$

and $$0.079 < \alpha_2 < 0.083 \quad (H),$$

where $da_1$ is a total thickness (Å) of said p-type amorphous layer and i-type amorphous silicon layer of said first laminated product, $dc_1$ is a thickness (Å) of said n-type microcrystalline layer of said first laminated product, $da_2$ is a total thickness (Å) of said p-type amorphous layer and i-type amorphous silicon germanium layer of said second laminated product, and $dc_2$ is a thickness (Å) of said n-type microcrystalline layer of said second laminated product.

6. The photovoltaic device as set forth in claim 5, wherein said photovoltaic device comprises a plurality of said first laminated product and/or said second laminated product.

7. A photovoltaic device comprising:

a transparent substrate;

a first conductive film with a transparent property formed on said substrate;

at least one laminated product of claim 1 formed on said first conductive film; and a second conductive film formed on said laminated product.

8. A photovoltaic device comprising:

a transparent substrate;

a first conductive film with a transparent property formed on said substrate;

at least one laminated product of claim 3 formed on said first conductive film; and a second conductive film formed on said laminated product.

9. A photovoltaic device comprising:

a transparent substrate;

a first conductive film with a transparent property formed on said substrate;

a first laminated product of claim 5 formed on said first conductive film;

a second laminated product of claim 5 formed on said first laminated product; and a second conductive film formed on said second laminated product.

* * * * *